United States Patent
Koveshnikov et al.

(10) Patent No.: US 6,620,632 B2
(45) Date of Patent: *Sep. 16, 2003

(54) METHOD FOR EVALUATING IMPURITY CONCENTRATIONS IN SEMICONDUCTOR SUBSTRATES

(75) Inventors: Sergei V. Koveshnikov, Vancouver, WA (US); Craig Rein, Vancouver, WA (US)

(73) Assignee: SEH America, Inc., Vancouver, WA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/544,197

(22) Filed: Apr. 6, 2000

(65) Prior Publication Data

US 2003/0138979 A1 Jul. 24, 2003

(51) Int. Cl.⁷ .............................................. H01L 21/66
(52) U.S. Cl. ..................... 438/14; 438/471; 438/476; 438/928
(58) Field of Search .......................... 438/14, 471, 476, 438/928

(56) References Cited

U.S. PATENT DOCUMENTS

| | | | |
|---|---|---|---|
| 4,053,335 A | | 10/1977 | Hu |
| 5,233,191 A | * | 8/1993 | Noguchi et al. ............. 250/306 |
| 5,970,366 A | | 10/1999 | Okonogi |
| 6,174,740 B1 | * | 1/2001 | Ohta et al. ...................... 438/14 |

FOREIGN PATENT DOCUMENTS

| | | | | |
|---|---|---|---|---|
| EP | 763735 A | * | 3/1997 | ........... G01N/33/20 |
| JP | 52069571 A | | 6/1977 | |
| JP | 10-223713 | * | 8/1998 | |

\* cited by examiner

*Primary Examiner*—Amir Zarabian
*Assistant Examiner*—Christy Novacek
(74) *Attorney, Agent, or Firm*—Alston & Bird LLP

(57) ABSTRACT

A method for evaluating the concentration of impurities in a semiconductor substrate. The method includes drawing together at least a portion of the impurities and measuring the concentration of impurities that were drawn together. In one embodiment of the invention, a gettering layer is formed adjacent one or more surfaces of the substrate to getter impurities from the substrate to the gettering layer. The impurity concentration of the gettering layer is then measured and the results are used to determine at least a range of impurity concentrations that were in the substrate prior to the drawing together.

17 Claims, 5 Drawing Sheets

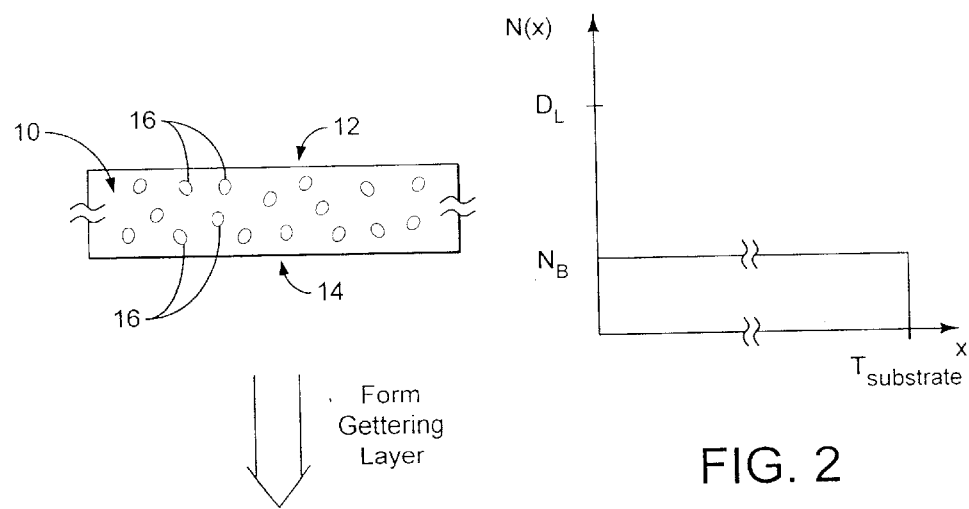
FIG. 2
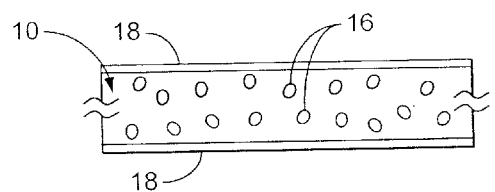
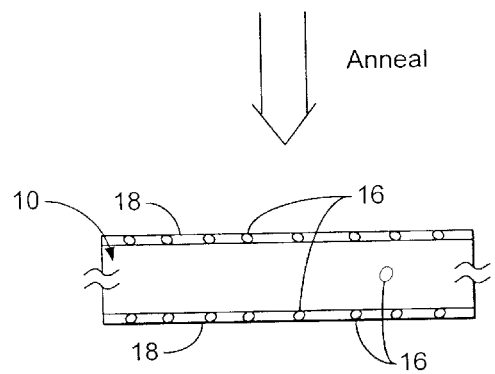
FIG. 1
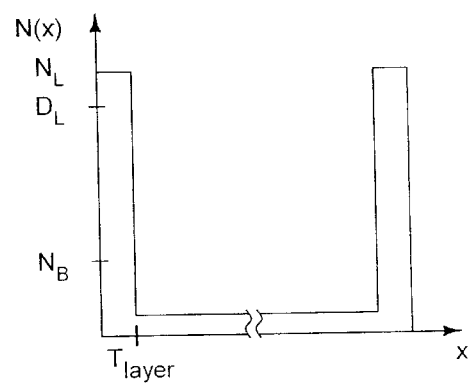
FIG. 3

METHOD FOR EVALUATING IMPURITY CONCENTRATIONS IN SEMICONDUCTOR SUBSTRATES

TECHNICAL FIELD

The present invention relates to semiconductor processing, and more particularly to measuring impurity concentrations in semiconductor substrates.

BACKGROUND OF THE INVENTION

Manufacturers of semiconductor integrated circuits are constantly striving to increase the performance and reduce the prices of their products. One way to both increase the performance and reduce the price of an integrated circuit is to reduce the size of the integrated circuit. By reducing the size of a circuit, more circuits can be manufactured on a single semiconductor substrate, thereby reducing the unit cost of the circuit. In addition, reducing the size of a circuit typically increases its speed and reduces its power consumption.

One problem manufacturers encounter in attempting to reduce the size of their integrated circuits involves impurity contamination. For example, metallic contamination of a semiconductor substrate can cause excess leakage currents, poor voltage breakdown characteristics, and reduced minority carrier lifetimes. As the size of an integrated circuit decreases, the detrimental effect of impurities in the semiconductor is magnified. For extremely small circuits, even relatively low levels of contamination can be sufficient to render the circuit inoperative. Therefore, manufacturers take extraordinary measures to prevent impurity contamination in their manufacturing processes.

To optimize their contamination control practices, manufacturers often need to measure the concentration of impurities in their semiconductor substrates at various points during the manufacturing process. This allows manufacturers to determine which area(s) of their process are causing impurity contamination problems. However, as the levels of impurity concentration have decreased to very low levels, it has become more and more difficult to measure the impurity concentration. Indeed, semiconductor industry standards such as the National Semiconductor Roadmap call for impurity concentrations to be as low as $10^{10}$ cm$^{-3}$ in the near future. Since the atomic density of a typical semiconductor substrate such as silicon is approximately $10^{22}$ cm$^{-3}$, impurity concentrations of $10^{10}$ cm$^{-3}$ can be very difficult to measure even with sophisticated measurement equipment.

For example, copper (Cu) and nickel (Ni) are two metallic impurities found in semiconductor substrates. Impurity concentrations of copper and nickel in heavily boron-doped substrates typically are measured by techniques such as Total Reflection X-Ray Fluorescence (TXRF) and Secondary Ion Mass Spectroscopy (SIMS), etc. The minimum detection limit of copper is approximately $10^{17}$ cm$^{-3}$ by TXRF (measured near the substrate surface), and approximately $10^{15}$ cm$^{-3}$ by SIMS. As a result, manufacturers have begun to search for new ways to measure impurity concentrations in semiconductor substrates.

SUMMARY OF THE INVENTION

The invention provides a method for evaluating the concentration of impurities in a semiconductor substrate. The method includes drawing together at least a portion of the impurities and measuring the concentration of impurities that were drawn together.

In one embodiment of the invention, a gettering layer is formed adjacent one or more surfaces of the substrate to getter impurities from the substrate to the gettering layer. The impurity concentration of the gettering layer is then measured and the results are used to determine at least a range of impurity concentrations that were in the substrate prior to the drawing together.

BRIEF DESCRIPTION OF THE DRAWINGS

FIG. 1 is a schematic flowchart diagram showing cross-sectional views of a semiconductor substrate, the diagram illustrates a method according to the present invention for drawing together impurities in a semiconductor substrate to one or more gettering layers formed on the substrate.

FIG. 2 is a graph showing the impurity concentration of the semiconductor substrate of FIG. 1 prior to the drawing together.

FIG. 3 is a graph showing the impurity concentration of the semiconductor substrate of FIG. 1 after the drawing together.

DETAILED DESCRIPTION AND BEST MODE FOR CARRYING OUT THE INVENTION

Figure 4:
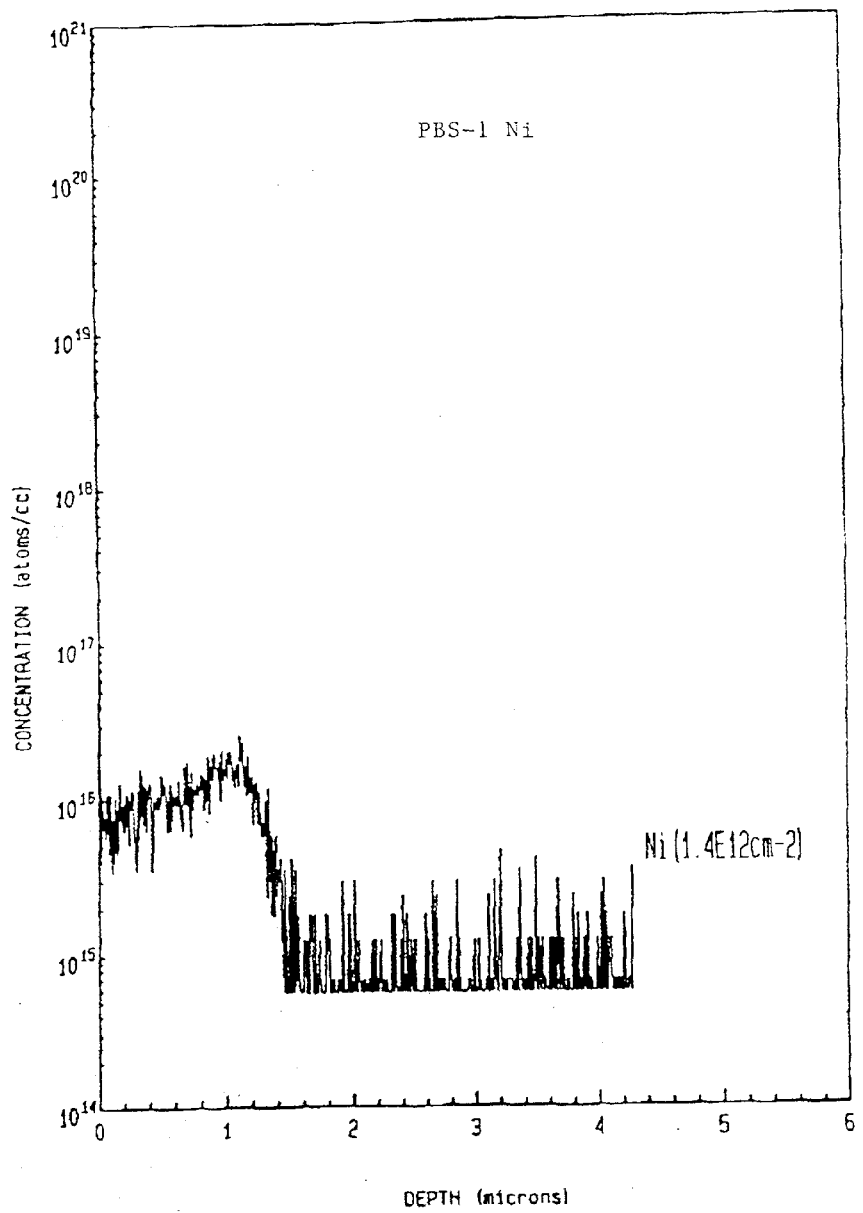
FIG. 4 is a graph showing a SIMS depth profile of a silicon wafer that has been contaminated with Nickel and then gettered. The graph demonstrates that the gettering efficiency is approximately 100%.

The invention provides a method for evaluating the concentration of impurities in a semiconductor substrate. The method includes drawing together at least a portion of the impurities in the semiconductor substrate, and measuring the concentration of impurities that were drawn together. The results of the measurement may be used to determine at least a range of concentrations of impurities that were in the semiconductor substrate prior to being drawn together. The invention also includes a method of monitoring contamination in a semiconductor process, as will be described in more detail below.

An exemplary semiconductor substrate for use with the present invention is indicated at 10 in FIG. 1. Substrate 10 typically is in the form of a circular disk having a diameter and thickness which conform to prescribed standards within the semiconductor industry. For example, many manufacturers currently use silicon wafers having a diameter of approximately 200 mm and a thickness of approximately 0.725 mm. However, it will be appreciated that substrate 10 may have a different diameter or thickness, or may be in a form other than a circular disk. Substrate 10 may also be formed of different semiconductor materials including germanium, gallium arsenide, etc. For clarity, the invention will be described in the context of measuring impurities in a silicon substrate.

Exemplary substrate 10 usually is a single crystal structure with a front surface 12 aligned substantially along the primary crystal plane. Substrate 10 also includes a back surface 14, which is substantially parallel to front surface 12. The substrate may be a "bare" substrate without circuit structures, or it may have partial or complete circuits fabricated thereon. Substrate 10 also includes one or more types of impurities 16 distributed within the crystal structure and having a bulk impurity concentration $N_B$ within the semiconductor substrate.

Many impurities such as copper diffuse rapidly through silicon. As a result, these impurities are usually substantially evenly distributed within the substrate. This is illustrated in FIG. 2 by the graph of concentration N(x) versus distance x into substrate 10. However, where the bulk impurity concentration $N_B$ is below the minimum impurity concentration detection limit $D_L$ of the measuring equipment, it can be difficult, if not impossible, to determine the bulk impurity concentration $N_B$.

The invention involves drawing together at least a portion of the impurities in the substrate, thereby creating a localized impurity concentration $N_L$ that is higher than the bulk impurity concentration $N_B$. If the localized impurity concentration $N_L$ is above the detection limit $D_L$, then the localized impurity concentration $N_L$ can be measured. The results of this measurement may then be used to evaluate $N_B$, as will be described in more detail below.

It will be appreciated by those of skill in the art that the impurities may be drawn together in a variety of ways. In the exemplary embodiment, the impurities are drawn together by gettering. Gettering is a natural process by which defects in the crystal lattice attract and capture impurities within the silicon. The impurities are attracted to, and captured by, the defects due to the strain the defects create in the crystal lattice. As a result, impurities tend to precipitate around the defects. The defects may be created in various ways. For example, defects may be created near a surface of the substrate by mechanically damaging the surface of the substrate through abrasion, sandblasting, or grooving. Lasers and ion implantation may also be used to create damage near a surface of the substrate. In these cases, impurities would be concentrated adjacent the damaged surface. Alternatively, selected materials such as silicon or oxygen may be incorporated into the crystal lattice by ion implantation to form gettering sites.

In the exemplary embodiment, gettering is accomplished by forming a gettering layer 18 on one or both of front and back surfaces 12 and 14, as shown in FIG. 1. This causes the impurities to be drawn into the gettering layer adjacent the substrate surface(s). The gettering layer may be formed of any suitable material. In the exemplary embodiment, polysilicon gettering layers are formed on the substrate. The impurities are drawn together to the grain boundaries within the polysilicon. The polysilicon may be formed by any of a variety of suitable processes as are known to those of skill in the art. For example, the polysilicon gettering layer may be formed by low pressure chemical vapor deposition (LPCVD) at approximately 600° C.–700° C.

To increase the portion of impurities gettered to the polysilicon layers, the substrates may be heated or annealed, as shown in FIG. 1. This enhances the diffusion of impurities within the substrate. For example, the substrate may be annealed at approximately 900° C. for approximately one hour, followed by a slow cool down to approximately 400°–500° C. The slow cool down allows sufficient time for the impurities to diffuse to the gettering layer and increases the likelihood that the impurities will be captured by the gettering layer. While it is virtually impossible to getter all of the impurities from the substrate, it has been found that the gettering efficiency of the polysilicon/anneal process described herein is over 99.9% for copper and nickel. This is illustrated in FIG. 3 by the graph of impurity concentration which shows the relatively high localized impurity concentration $N_L$ in the gettering layers, and the relatively low bulk concentration $N_B$ in the substrate.

Figure 5:
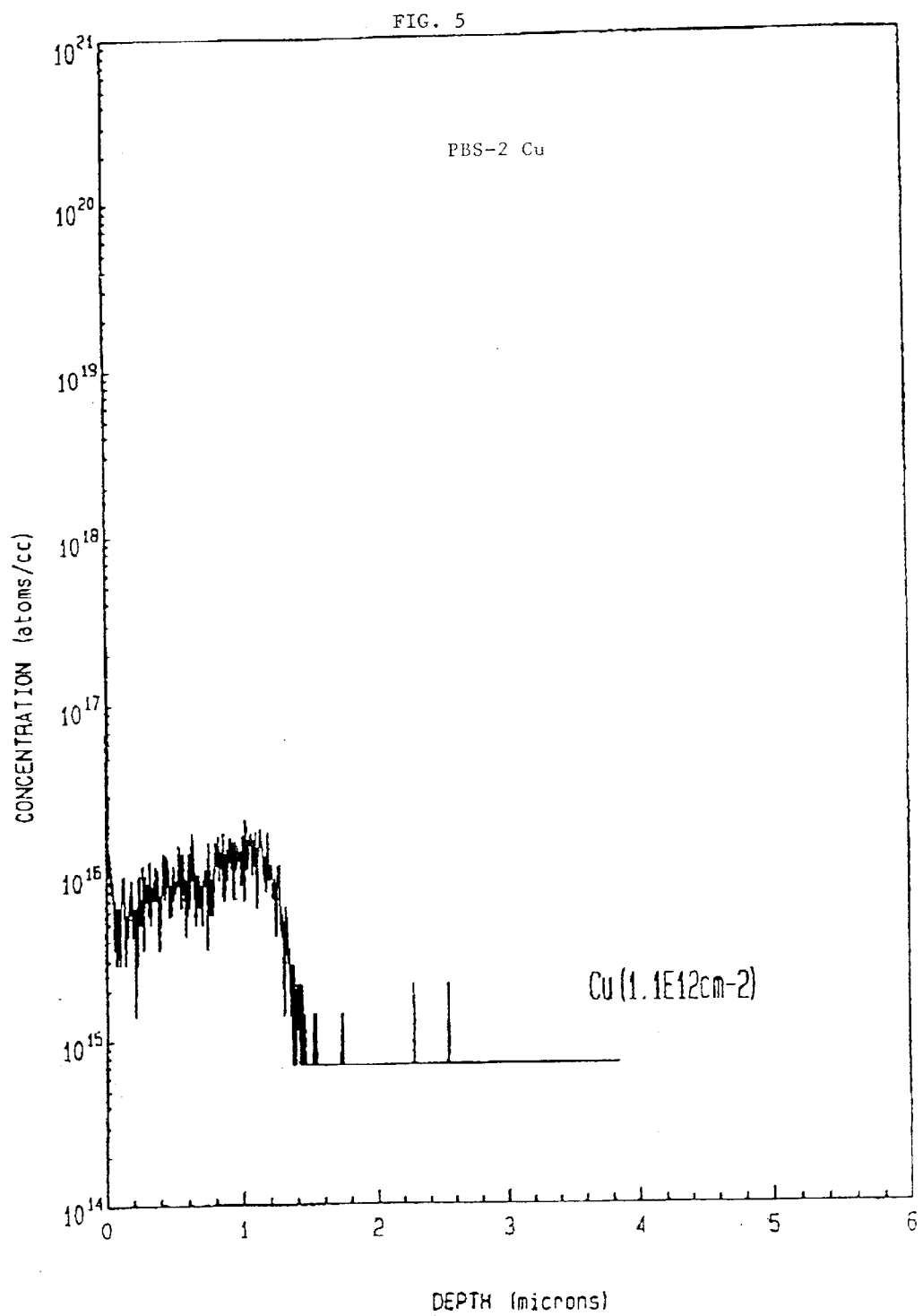
FIG. 5 is a graph showing a SIMS depth profile of a silicon wafer that has been contaminated with Copper and then gettered. The graph demonstrates that the gettering efficiency is approximately 100%.

FIGS. 4 and 5 provide experimental verification of the feasibility of the novel detection method. These graphs present SIMS depth profiles for Nickel and Copper which were intentionally introduced into silicon wafers via ion implantation to a dose of $2\times10^{12}$ $cm^{-2}$, followed by a polysilicon deposition layer one micron thick on both sides of the wafers, and then gettering annealing. As can be seen, the gettering efficiency of polysilicon is approximately 100%. In fact, the measured impurity concentration exceeds the concentration of intentionally introduced contamination, which indicates the presence of some initial contamination of the wafers prior to the intentional contamination.

In the graph shown in FIG. 3, the localized impurity concentration $N_L$ is higher than the lower detection limit of the measurement instrument $D_L$, thereby allowing $N_L$ to be measured. Thus, the drawing together of impurities serves to magnify the impurity concentration to a level that is more easily measured using available measurement instruments. It will be appreciated that the total number of impurities will remain substantially constant through the gettering process (assuming no significant concentration of impurities is added to the substrate during the LPCVD or anneal process steps). In other words, the area under the curves N(x) in FIGS. 2 and 3 will also remain substantially constant. Thus, $N_L$ can be calculated from $N_B$ according to the following formula, where "$T_{substrate}$" is the thickness of the substrate, "$T_{layer}$" is the thickness of the gettering layer, and "P" is the percentage of impurities drawn together to the gettering layer:

$$N_L = \frac{P * N_B * T_{substrate}}{T_{layer}}$$

Where substantially all of the impurities are drawn to the gettering layer, the above equation reduces to:

$$N_L = \frac{N_B * T_{substrate}}{T_{layer}}$$

As used herein, "substantially all of the impurities" means that the number of impurities remaining in the bulk substrate is not sufficient to effect the calculation of impurity concentration and, thus, may be ignored.

The latter formula demonstrates that the degree of magnification of the impurity concentration in the gettering layer (with respect to the bulk impurity concentration) will be proportional to the ratio of the substrate thickness and the gettering layer thickness. For example, where the substrate thickness is $10^6$ times the thickness of the gettering layer, then the localized impurity concentration $N_L$ will be $10^6$ times the bulk impurity concentration $N_B$. Thus, for a particular substrate having a particular thickness, the magnification of the impurity concentration can be controlled by adjusting the thickness of the gettering layer. Typical gettering layer thicknesses may be 5–50 nm, or preferably 10–15 nm. Nevertheless, thinner or thicker gettering layers may be desired and achievable depending on the application, and therefore, are also within the scope of the invention.

To illustrate how drawing the impurities together in the gettering layer magnifies the impurity concentration, assume a standard 200 mm silicon wafer having a thickness of 0.0725 cm and a bulk impurity concentration $N_B$ of $5 \times 10^{12}$ cm$^{-3}$. If a $10^{-6}$ cm (10 nm) polysilicon gettering layer is formed on the back surface of the wafer and substantially all of the impurities are gettered to the polysilicon layer, then the localized impurity concentration in the polysilicon gettering layer would be:

$$N_L = \frac{N_B * T_{substrate}}{T_{layer}}$$

$$N_L = \frac{5 \times 10^{12} * 7.25 \times 10^{-2}}{10^{-6}}$$

$$N_L = 3.625 \times 10^{17} \text{ cm}^{-3}$$

Thus, while the bulk concentration $N_B$ in the above illustration was too low to measure with either TXRF or SIMS, the localized impurity concentration $N_L$ is well within detection limits of both measurement techniques.

Once the localized impurity concentration $N_L$ has been measured, the results can be used to evaluate the bulk concentration $N_B$ that existed prior to gettering. The formula for calculating the bulk concentration $N_B$ from the measured localized concentration is as follows:

$$N_B = \frac{N_L * T_{layer}}{P * T_{substrate}}$$

Assuming substantially all of the impurities were drawn together to the gettering layer, this reduces to:

$$N_B = \frac{N_L * T_{layer}}{T_{substrate}}$$

Figure 6:
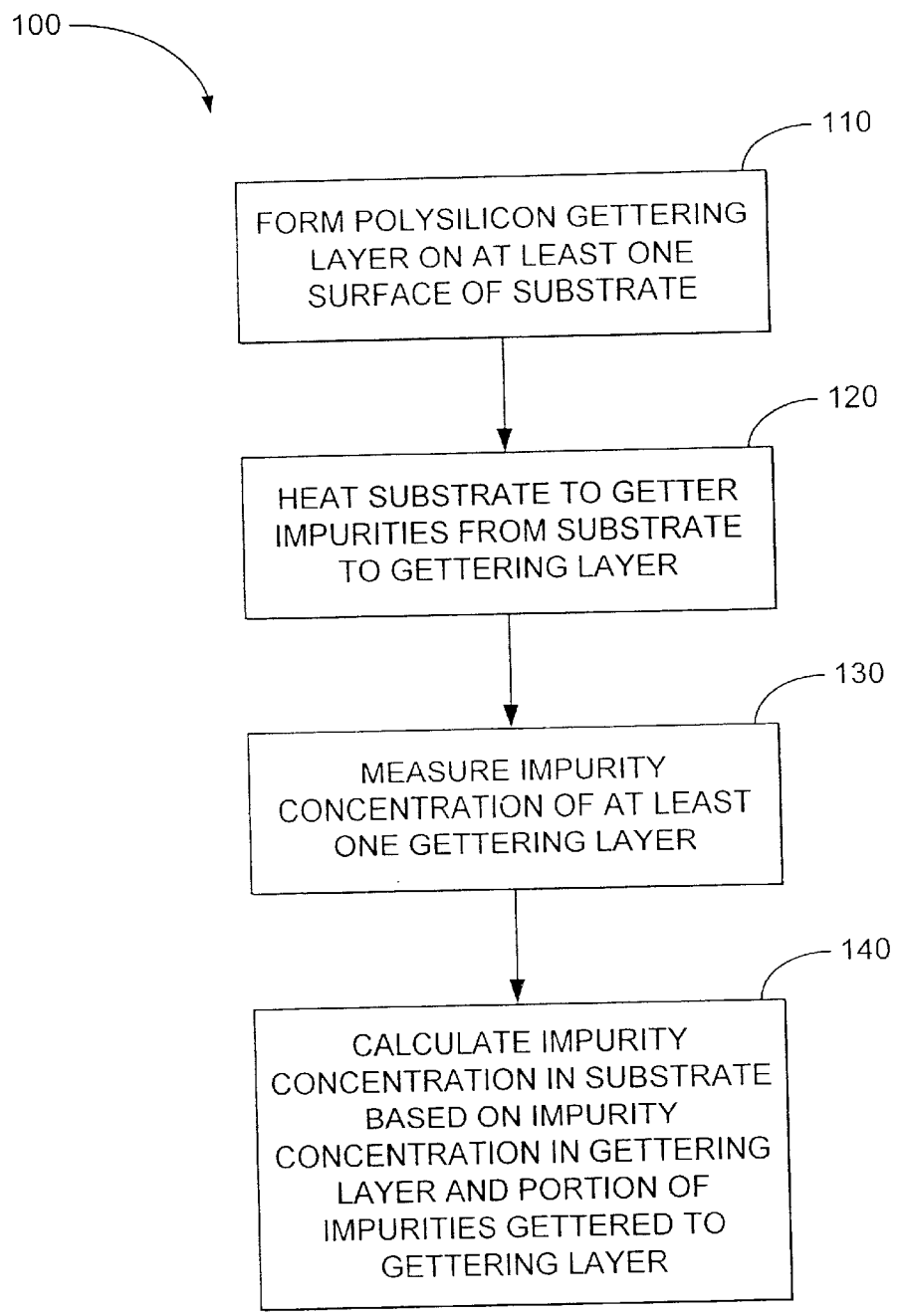
FIG. 6 is a flowchart illustrating a method of evaluating the concentration of impurities in a semiconductor substrate according to the present invention.

FIG. 6 illustrates an exemplary method, indicated generally at 100, for determining the bulk impurity concentration of a semiconductor substrate with a particular measurement instrument even though the bulk impurity concentration is lower than the minimum detection limit of the measurement instrument. The method includes, at 110, forming a polysilicon gettering layer on at least one surface of the semiconductor substrate. As described above, the thickness of the gettering layer may be selected to provide the desired degree of magnification of the impurity concentration. The substrate is then annealed or heated to getter the impurities from the substrate to the gettering layer. The temperature and duration of the anneal may be selected to ensure sufficient gettering efficiency. The impurity concentration of the gettering layer is then measured, as indicated at 130, by any suitable measurement instrument such as TXRF, SIMS, etc. It will be appreciated that the particular measurement instrument used may vary depending on the type of impurity to be measured and/or the concentration of the impurity. Finally, the method includes calculating the bulk impurity concentration based on the concentration of impurities in the gettering layer and the portion of impurities that were gettered, as indicated at 140.

As described above, the method of drawing together the impurities in a semiconductor substrate to form a localized impurity concentration substantially improves the effective measurement capability of a variety of measurement instruments. Even where the localized impurity concentration is still below the minimum detection limit of the instrument, the method allows the determination of at least a range of bulk impurity concentrations. For example, if the minimum detection limit $D_L$ of a particular measurement instrument is $10^{15}$ cm$^{-3}$, and the localized impurity concentration in a 10 nm gettering layer is not measurable, then it can be determined that the bulk concentration of a 0.0725 cm thick substrate was in a range less than $N_L * T_{layer}/T_{substrate} = (10^{15}$ cm$^{-3})(10^{-6}$ cm$)/(7.25 \times 10^{-2}$ cm$) \approx 10^{-10}$ cm$^{-3}$.

Alternatively, the method may also be used where the bulk impurity concentration is very near or above the detection limit $D_L$ of the measurement instrument. By drawing together the impurities to create a localized impurity concentration, the method may allow the bulk concentration to be measured more easily and/or more accurately.

The invention is particularly useful for measuring low impurity levels in highly doped semiconductor material including low-resistivity, boron-doped silicon. In such substrate materials, the high dopant concentration precludes determining the impurity concentration by measuring the electrical characteristics of the substrate. In contrast, the method described above is independent of the doping level within the substrate.

Another aspect of the invention involves monitoring a semiconductor process for impurity contamination. The invention may be used to monitor virtually any semiconductor manufacturing process including crystal growth, polishing, cleaning, etching, thin film deposition, photolithography, ion implantation, oxidation, planarization, etc. Furthermore, the invention may be incorporated in existing semiconductor manufacturing processes without substantially increasing costs or reducing throughput.

Figure 7:
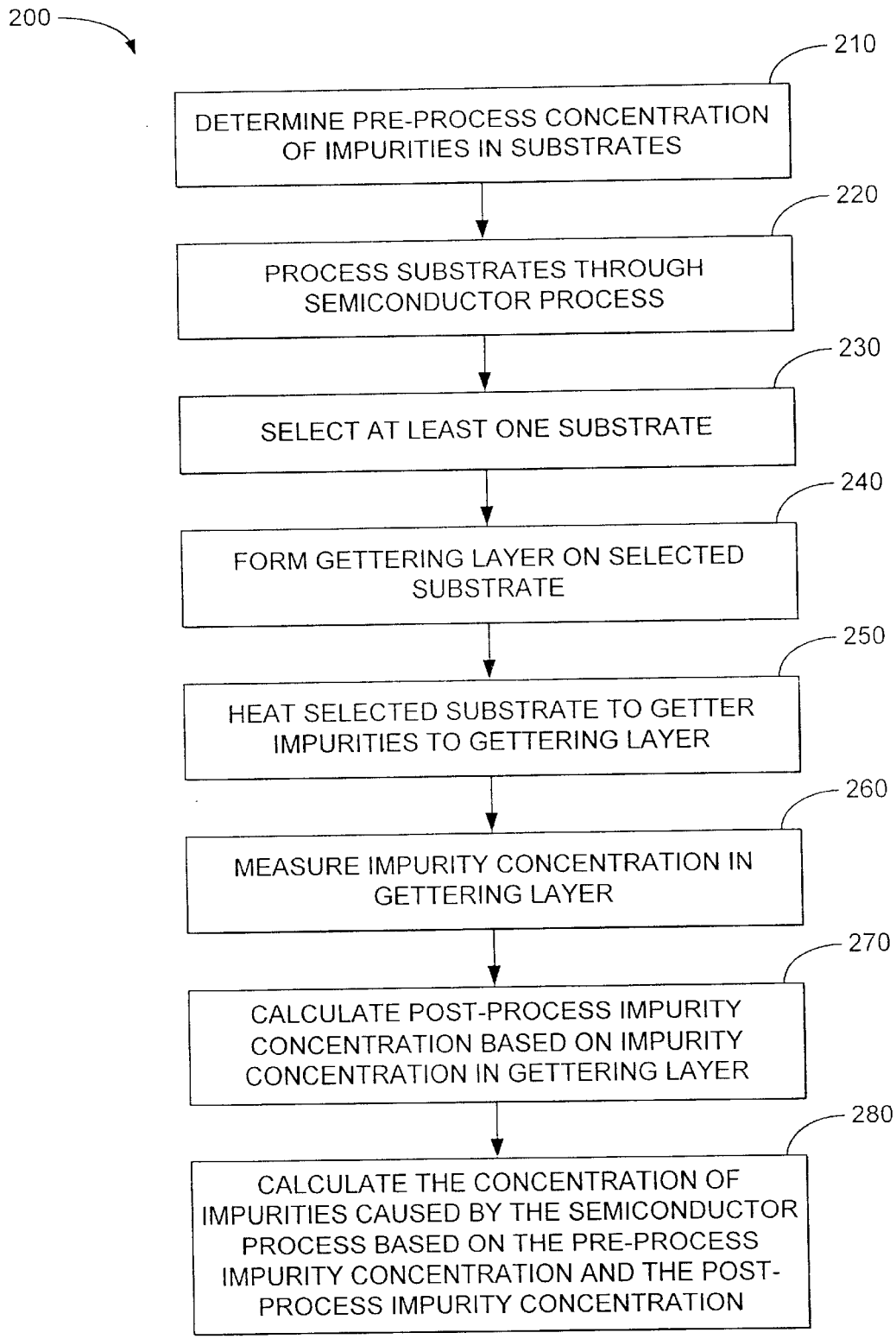
FIG. 7 is a flowchart illustrating a method of monitoring impurity contamination in a semiconductor process according to the present invention.

An exemplary method for monitoring a semiconductor process is indicated generally at 200 in FIG. 7. The method includes, at 210, determining the "pre-process" bulk concentration of impurities in one or more semiconductor substrates. This may be performed by the method described above or by any other suitable method. Alternatively, this step may be omitted and the pre-process bulk impurity concentration may be presumed to be at a particular concentration. The one or more substrates are then processed through the semiconductor process, as indicated at 220.

Once the substrates have been processed, at least one of the substrates is selected for measurement, as indicated at 230. Optionally, a sufficient number of substrates are selected to constitute a statistically valid sampling according to known statistical process control techniques. Typically, the substrate(s) are selected from one or more "monitor" substrates that are processed through the semiconductor process along with actual "device" substrates. Unlike device substrates, monitor substrates may not have been processed through prior processing steps, and may not include portions of integrated circuits. Nevertheless, the impurity concentrations in the device substrates should be similar to the impurity concentrations in the monitor substrates. In addition, selecting monitor substrates preserves valuable device substrates against any damage caused by measuring the impurity concentration. The selected substrate(s) usually are also the substrate(s) from which the pre-process impurity concentration was determined at 210.

One or more gettering layers are then formed on the selected substrate, as indicated at 240, after which the selected substrate is annealed, as indicated at 250. The impurity concentration in the gettering layer is then measured by suitable means, as indicated at 260. Based on the impurity concentration in the gettering layer, the "post-process" bulk impurity concentration may be calculated using the equations described above, as indicated at 270. Finally, the concentration of impurities caused by the semiconductor process is calculated based on the pre-process and post-process impurity concentrations, as indicated at 280. Where substantially all of the impurities were gettered to the gettering layer, the concentration of impurities caused by the semiconductor process may be calculated by subtracting the post-process impurity concentration from the pre-process impurity concentration.

INDUSTRIAL APPLICABILITY

This invention is applicable to semiconductor manufacturing, and is particularly applicable to measuring impurity concentrations in semiconductor substrates.

The specific embodiments disclosed and illustrated herein are not to be considered in a limiting sense as numerous variations are possible. The subject matter of the inventions includes all novel and non-obvious combinations and sub-combinations of the various elements, features, functions and/or properties disclosed herein. Where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

We claim:

1. A method of evaluating the concentration of impurities in a semiconductor substrate, the method comprising:
   drawing together at least a portion of the impurities in the semiconductor substrate by forming a gettering layer adjacent a surface of the substrate and gettering a portion of the impurities that were in the semiconductor substrate prior to formation of the gettering layer into the gettering layer;
   measuring the concentration of the impurities previously distributed throughout the semiconductor substrate that were drawn into the gettering layer; and
   determining at least a range of concentrations of impurities that were in the substrate prior to formation of the gettering layer and were subsequently drawn together based on the measurement of the impurity concentration in the gettering layer and respective thicknesses of the gettering layer and the semiconductor substrate.

2. The method of claim 1, wherein the gettering layer is polysilicon.

3. The method of claim 1, wherein the drawing together includes drawing together substantially all of the impurities adjacent one or more surfaces of the substrate.

4. The method of claim 1, wherein the drawing together includes:
   forming polysilicon gettering layers on front and back surfaces of the substrate, and
   heating the substrate to getter the impurities into the polysilicon gettering layers.

5. The method of claim 4, wherein the measuring includes measuring the impurities in at least one of the polysilicon gettering layers.

6. A method of determining the bulk concentration of impurities substantially evenly distributed in a semiconductor substrate using an impurity measurement instrument, where the bulk concentration is lower than the minimum detection limit of the measurement instrument, the method comprising:
   drawing together a determined portion of the impurities previously distributed throughout the substrate to a selected location to create a localized impurity concentration higher than the minimum detection limit of the measurement instrument;
   measuring the localized impurity concentration of the selected location with the measurement instrument; and
   calculating the bulk concentration of impurities previously distributed throughout the semiconductor substrate based on a percentage of impurities drawn together to the selected location and the localized impurity concentration.

7. The method of claim 6, wherein the drawing together includes gettering.

8. The method of claim 7, wherein the drawing together includes forming one or more gettering layers adjacent one or more surfaces of the substrate to getter the impurities in the substrate to the one or more gettering layers.

9. The method of claim 8, wherein the measuring includes measuring the concentration of impurities in at least one of the gettering layers.

10. The method of claim 8, wherein the drawing together includes gettering substantially all of the impurities in the substrate to the one or more gettering layers.

11. The method of claim 6, wherein the impurities include at least one of copper or nickel.

12. A method of monitoring impurity contamination in a semiconductor process, comprising:
   processing one or more semiconductor substrates through the semiconductor process, each semiconductor substrate having front and back surfaces;
   selecting at least one of the semiconductor substrates;
   forming a polysilicon gettering layer on at least one of the surfaces of the selected substrate;
   gettering impurities previously distributed throughout the selected substrate into the polysilicon gettering layer;
   measuring the concentration of impurities previously distributed throughout the selected substrate that are concentrated in the polysilicon gettering layer; and
   determining at least a range of concentrations of impurities that were in the selected substrate prior to forming the polysilicon gettering layer based on the measurement.

13. The method of claim 12, further comprising heating the selected substrate to getter impurities from the selected substrate into the gettering layer.

14. The method of claim 12, wherein the selecting includes selecting a statistical sampling of the semiconductor substrates processed through the semiconductor process.

15. The method of claim 12, further comprising calculating a post-process concentration of impurities in the one or more substrates based on the concentration of impurities in the gettering layer.

16. The method of claim 15, further comprising determining a pre-process concentration of impurities in the selected substrate prior to the step of processing.

17. The method of claim 16, further comprising calculating the concentration of impurities caused by the semiconductor process based on the pre-process concentration of impurities and the post-process concentration of impurities.

* * * * *